United States Patent [19]
Flory et al.

[11] Patent Number: 5,712,605
[45] Date of Patent: Jan. 27, 1998

[54] MICROWAVE RESONATOR

[75] Inventors: Curt A. Flory, Los Altos; Robert C. Taber, Palo Alto, both of Calif.

[73] Assignee: Hewlett-Packard Co., Palo Alto, Calif.

[21] Appl. No.: 315,281

[22] Filed: Sep. 29, 1994

Related U.S. Application Data

[63] Continuation-in-part of Ser. No. 238,675, May 5, 1994, abandoned.

[51] Int. Cl.$^6$ .................................................. H01P 7/10
[52] U.S. Cl. ................ 333/219.1; 333/227; 331/107 DP
[58] Field of Search ........................ 333/219.1, 222, 333/239, 227, 248, 234, 96, 107 DP

[56] References Cited

U.S. PATENT DOCUMENTS

| | | | |
|---|---|---|---|
| Re. 32,768 | 10/1988 | D'Avello et al. | 333/202 |
| 5,200,721 | 4/1993 | Mansour | 333/202 |

FOREIGN PATENT DOCUMENTS 0 352 628   7/1989   Japan.

OTHER PUBLICATIONS

Jiao, X. A. et al., "Whispering—Gallery Modes of Dielectric Structures: Applications to MM—Wave Band-Stop Filters", IEEE Trans on Microwave Theory & Techniques, MTT35, No. 12, Dec. 1987, pp. 1169–1175.

Vedrenne, C. et al., "Whispering—gallery modes of dielectric resonators", IEE Proceedings Section AAI, vol. 129, No. 4, part H, Aug. 1982, pp. 183–187, Old Woking, Surrey, GB.

C. J. Maggiore, et al. "Low–loss microwave cavity using layered–dielectric materials," Applied Physics Letters, vol. 64, No. 11, Mar. 14, 1994, pp. 1451–1453.

M. P. Mladenovic, et al. "Calculation of resonances of microwave resonator loaded with inhomogenous dielectric layer," Electronics Letters, vol. 27, No. 24, Nov. 21, 1991, pp. 2215–2216.

C. A. Flory and R. C. Taber, "Microwave Oscillators Incorporating Cryogenic Sapphire Dielectric Resonators", Jun. 2, 1993 IEEE International Frequency Control Symposium, pp. 763–773.

M. E. Tobar, A. J. Giles, S. Edwards and J. Searls, "High–Q TE Stabilized Sapphire Microwave Resonators For Low Noise Applications", Forty-Seventh annual Symposium on Frequency Control, pp. 1–8.

D. G. Blair and I. N. Evans, "High–Q Microwave Properties of a Sapphire Ring Resonator", J. Phys.D: Appl. Phys., 15 (1962) pp. 1651–1656.

(List continued on next page.)

*Primary Examiner*—Robert Pascal
*Assistant Examiner*—David Vu
*Attorney, Agent, or Firm*—Jack A. Lenell

[57] ABSTRACT

A simplified apparatus and a design method for providing microwave resonators having high Q factors. The apparatus includes a resonant microwave cavity having three mutually orthogonal dimensions and a low loss dielectric body substantially enclosing each dimension of the resonant microwave cavity. To further increase Q-factor, the apparatus of the invention preferably includes a plurality of resonant microwave cavities and a plurality of low loss dielectric bodies each substantially enclosing a respective one of the microwave resonant cavities. In some embodiments the low loss dielectric bodies are arranged in a stack. In other embodiments the low loss dielectric bodies are concentrically arranged. The design method includes selecting a resonant mode frequency and a height dimension of a microwave resonant cavity, extending radial bessel function solutions along a radius of the cavity to determine radial locations of electric field nulls of a resonant mode of microwaves, and substantially positioning concentric dielectric tube portions of the bodies at the radial locations of the electric field nulls. Similarly, the method of the invention includes extending cavity harmonic function solutions along the axis of symmetry of the cavity to determine axial locations of electric field nulls of the resonant mode of microwaves, and substantially positioning dielectric plate portions of the bodies at the axial locations of the electric field nulls.

17 Claims, 11 Drawing Sheets

OTHER PUBLICATIONS

G. John Dick and David G. Santiago, "Microwave Frequency Discriminator with a Cryogenic Sapphire Resonator for Ultra-Low Phase Noise", 6th European Frequency & Time Forum, 1989.

G. J. Dick and D. M. Strayer, "Measurement and Analysis of Cryogenic Sapphire Dielectric Resonators and DRO's", 4th Annual Frequency Control Symposium, 1987, pp. 487–491.

David G. Santiago and G. John Dick, "Closed Loop Tests of the Nasa Sapphire Phase Stabilizer", 1993 IEEE International Frequency Control Symposium, pp. 774–777.

G. John Dick and Jon Sanders, "Measurement and Analysis of a Microwave Oscillator Stabilized by a Sapphire Dielectric Ring Resonator for Ultra-Low Noise", IEEE Transactions on Ultrasonics, Ferroelectrics, and Frequency Control, vol. 37, No. 5, Sep., 1990, pp. 339–346.

R. Comte, S. Verdeyme and P. Guillon, "New Concept for Low-Loss Microwave Devices", Electronics Letters, 3 Mar. 1994, pp. 419–420.

C. J. Maggiore, A. M. Clogston, G. Spalek, W. C. Sailor, and F. M. Mueller, "Low-Loss Microwave Cavity Using Layered-Dielectric Materials", Appl. Phys. Lett. 64 (11), 14 Mar. 1994, pp. 1451–1453.

J. D. Jackson, "Classical Electrodynamics (Resonant Cavities)", John Wiley & Sons, New York, (1975), Chapter 8, pp. 353–357.

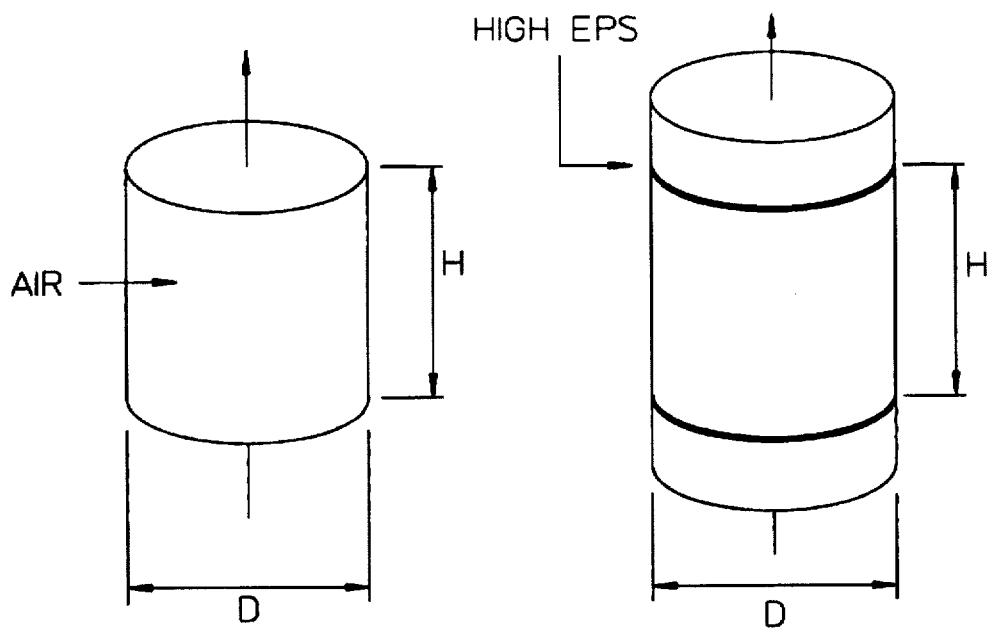
FIG. 1A (PRIOR ART)   FIG. 1B (PRIOR ART)
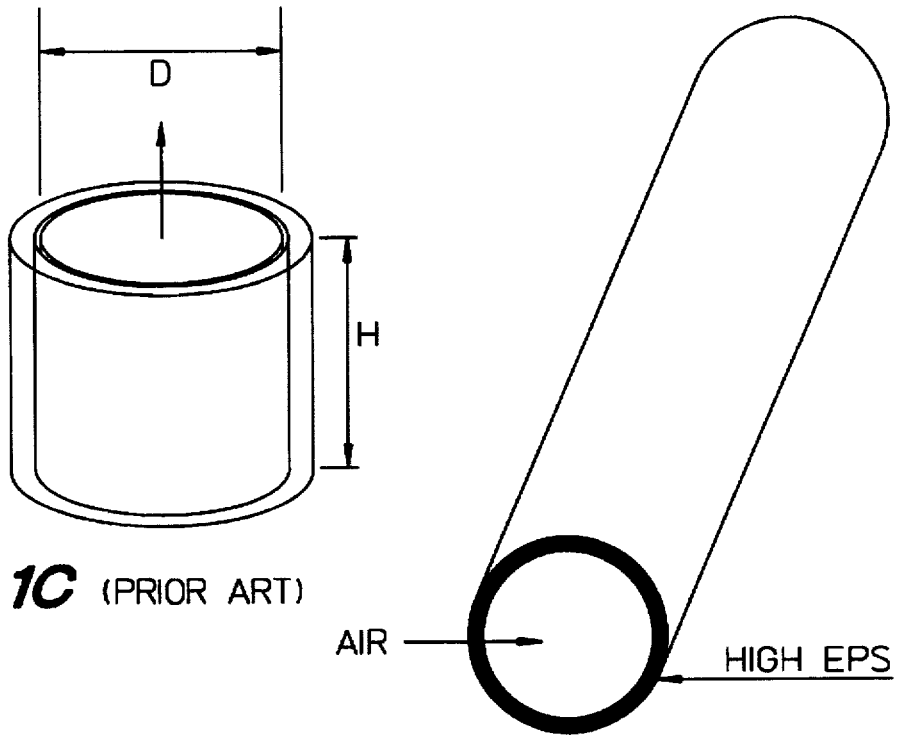
FIG. 1C (PRIOR ART)
FIG. 1D (PRIOR ART)

MICROWAVE RESONATOR

CROSS REFERENCE TO RELATED APPLICATION

This is a continuation-in-part of application Ser. No. 08/238,675 filed May 5, 1994, now abandoned.

FIELD OF THE INVENTION

The present invention relates to components used in electronic oscillators, and more particularly relates to microwave resonators.

BACKGROUND OF THE INVENTION

Microwave systems such as satellite communications systems and RADAR systems provide a convenient and accurate way of gathering and transmitting information in commercial as well as military applications. For example, satellite communications systems use microwaves to route thousands of channels of telephone, data, and video information around the globe. As another example, RADAR systems provide a convenient and accurate way for busy airports to collect data about air traffic. At the heart of each of these systems is a microwave resonator for generating pure signals at a single microwave frequency, which are then used in conjunction with additional electronic equipment for transmitting or receiving information. It has been discovered that making microwave resonators that have low power loss allows greater sensitivity, so that advanced RADAR systems can detect a larger number of smaller aircraft. Such advanced RADAR systems have now been proven to increase airport safety and reduce risks to airline passengers. Additionally, microwave resonators that have low power loss allow satellite systems to save money by using a larger number of channels at lower power levels.

Traditional metallic cavities have been used as microwave resonators for many years. Power loss in these devices is imposed by resistive losses encountered by a resonant mode's attendant shielding currents in enclosure walls of the metallic cavities. A figure of merit indicative of loss in microwave resonators is known as Q factor, which is defined as the microwave frequency of the resonator times a ratio of the microwave energy stored in the resonator and the average microwave power loss in the resonator. Q factor of traditional metallic cavities can be considerably increased by using dielectric materials in a Q factor improvement scheme as taught in "New concept for low-loss microwave devices" by Comte et al., Electronics Letters Vol. 30 No. 5, pp 419 and 420.

FIGS. 1A–1D show some teachings of the prior art. For example, as shown in FIG. 1A, an air filled traditional metallic cavity having a diameter, D, of forty two millimeters and a height, H, of fifteen millimeters resonates at a microwave frequency of 13.20 Gigahertz. According to Comte et al., this traditional metal cavity has a Q factor of 15,120. By modifying the traditional metallic cavity in accordance with the teachings of Comte et al., a considerably increased Q of 26,200 can be achieved at a substantially identical microwave frequency of 13.22 Gigahertz. More specifically, as shown in FIG. 1B, the traditional metallic cavity of FIG. 1A is modified using the teachings of Comte et al. by introducing two plates of a high electric permittivity (high eps) dielectric material at the top and bottom, respectively, of the cavity, the distance between them being the same as the height, H, of the cavity in FIG. 1A. The diameter, D, of the metallic cavity as shown in FIG. 1B is the same as the diameter, D, of the metallic cavity in FIG. 1A. According to Comte et al., the high electric permittivity (high eps) dielectric material of the plates has an electric permittivity of 36. It should be particularly noted that although the high eps material of the plates has been characterized as "lossless" by Comte et al., the high eps material of the plates is still taught by Comte et al. as having a loss tangent of $3.3 \times 10^{-4}$, which is a relatively high dielectric loss tangent.

As illustrated in FIG. 1C, Comte et al. further teach another embodiment wherein the traditional metal cavity is modified by introducing a dielectric hollow pipe in the cavity, the diameter, D, of the pipe being shown as the same as the diameter of the metallic cavity in FIG. 1A. A height, H, of the metallic cavity shown in FIG. 1C is the same as the height of the metallic cavity in FIG. 1A. According to the first full paragraph on page 420 of the article by Comte et al., if the traditional metallic cavity modified as shown in FIG. 1C gives no Q factor gain, that is because in the given example, the ratio of diameter to height, D/H, is too high and so no significant metallic losses exist on the lateral faces. Comte et al. suggest that this ratio of diameter to height, D/H, can be optimized to obtain better results. Comte et al. consistently teach using high electric permittivity (high eps) dielectrics, as shown again in FIG. 1D, which illustrates an air filled, high electric permittivity (high eps) dielectric waveguide. Unfortunately, selection of known high electric permittivity (high eps) dielectric materials is typically limited to those that also have relatively high loss tangents, such as those materials taught by Comte et al.

Other previously known schemes such as those shown in "Low-Loss Microwave Cavity Using Layered-Dielectric Materials" by Maggiore et al., Applied Physics Letters, Mar. 14, 1994, pp. 1451–1453, provide limited Q factor improvement using more complex resonator designs. As explained in the last paragraph of page 1452 of the Maggiore article, when many dielectric plates are included in the design, the cavity has a Q which saturates, limiting Q factor improvement.

While the teachings of the prior art provide some improvements in Q factor, what is needed is a simplified apparatus and design method for providing a microwave resonator having a Q factor far higher than that which is known in the prior art.

SUMMARY OF THE INVENTION

The present invention provides a simplified apparatus and a design method for providing microwave resonators having high Q factors. Using the teachings of the invention achieves Q factors far higher than those known in the prior art.

Briefly, and in general terms, the apparatus of the invention comprises a resonant microwave cavity having three mutually orthogonal dimensions and a low loss dielectric body substantially enclosing each dimension of the resonant microwave cavity. In resonators of the prior art substantial power loss is imposed by resistive losses encountered by a resonant mode's attendant shielding currents in enclosure walls of metal cavities. At best, previously known Q-factor improvement schemes provide only a partial solution. Despite the use of dielectric structures within metal cavities in previously known schemes, they provide no dielectric structures substantially enclosing each dimension of any resonant microwave cavity.

It is theorized that the ultimate Q-factor achievable for a resonator structure is dictated by the loss tangent of the dielectric material of the body. Contrary to some teachings of the prior art, it is generally undesirable to use high electric permittivity (high eps) dielectrics, such as those having electric permittivity of 36, because such dielectrics have a relatively high loss tangent, such as a loss tangent of $3.3 \times 10^{-4}$. To provide Q factors far higher than that of prior art resonators, it is preferred that the dielectric material of body of the invention have a loss tangent lower than $3.3 \times 10^{-4}$. For example very low loss tangents are found in materials such as monocrystaline sapphire or quartz. In general, materials that have such low loss tangents also have low electric permittivity (low eps), for example electric permittivity below 36. Performance is further enhance by cooling the dielectric body to cryogenic temperatures. However, using the teachings of the invention room temperature still achieves unexpected, superior results of an extraordinarily high Q factor.

In the apparatus of the invention, the resonant microwave cavity supports a resonant mode of microwaves having modal electric field nulls. In accordance with the principles of the invention, the low loss dielectric body has an inner surface disposed at locations of the modal electric field nulls. The preferred embodiment of invention further comprises a metal housing having an inner surface substantially enclosing the dielectric body. Of course, because of boundary conditions imposed by the metal housing, there are additional modal electric field nulls located at the inner surface of the metal housing. However, in the present invention the inner surface of the metal housing is sufficiently spaced apart from the inner surface of the dielectric body so as to maintain location of the modal electric field nulls at the inner surface of the dielectric body.

To further increase Q-factor, the apparatus of the invention preferably includes a plurality of resonant microwave cavities arranged so that the low loss dielectric body substantially encloses each of the microwave resonant cavities. In some embodiments the resonant cavities are concentrically arranged. The low loss dielectric body has a plurality of inner surfaces that substantially define the plurality of resonant cavities. The plurality of resonant microwave cavities support a resonant mode of microwaves having modal electric field nulls. In accordance with the principles of the invention the inner surfaces of the low loss dielectric body are disposed at locations of the modal electric field nulls.

The design method of the invention includes selecting a resonant mode frequency and a height dimension of a microwave resonant cavity. The method further includes extending radial bessel function solutions along a radius of the cavity to determine radial locations of electric field nulls of a resonant mode of microwaves, and substantially positioning concentric dielectric tube portions at the radial locations of the electric field nulls. Similarly, the method of the invention includes extending cavity harmonic function solutions along an axis of symmetry of the cavity to determine axial locations of electric field nulls of the resonant mode of microwaves and substantially positioning dielectric plates at the axial locations of the electric field nulls.

Other aspects and advantages of the present invention will become apparent from the following detailed description, taken in conjunction with the accompanying drawings, illustrating by way of example the principles of the invention.

BRIEF DESCRIPTION OF THE DRAWINGS

FIGS. 1A–1D show some teachings of the prior art.

DETAILED DESCRIPTION OF PREFERRED EMBODIMENT

Figure 2A:
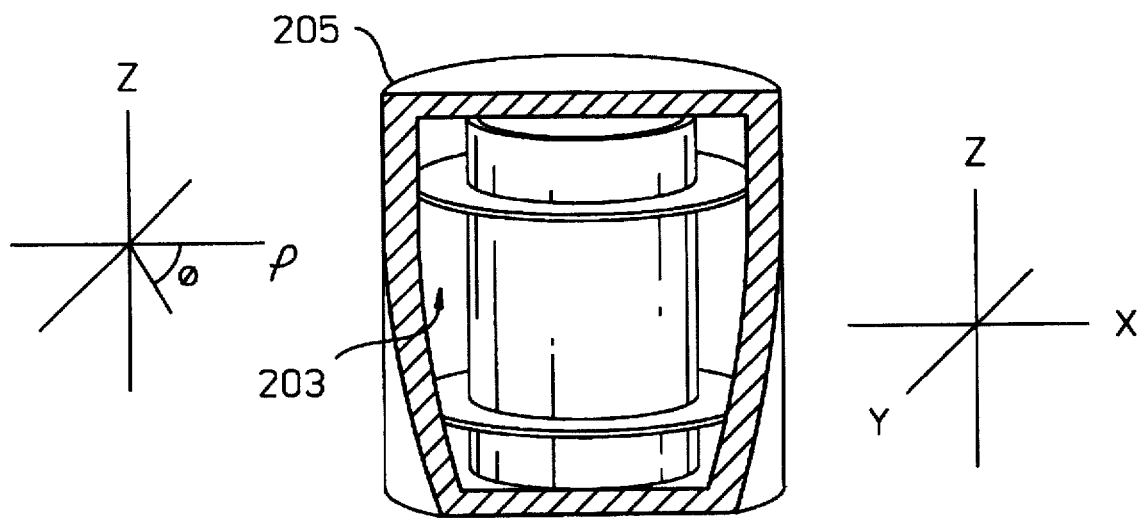
FIGS. 2A, 2B, and 2C show various views of a preferred embodiment of the apparatus of the invention.
Figure 2B:
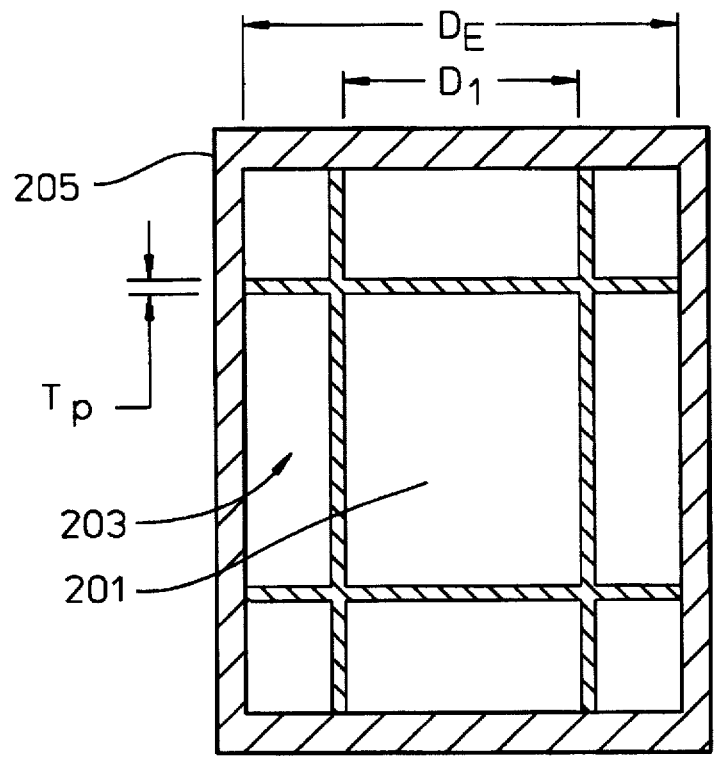
Figure 2C:
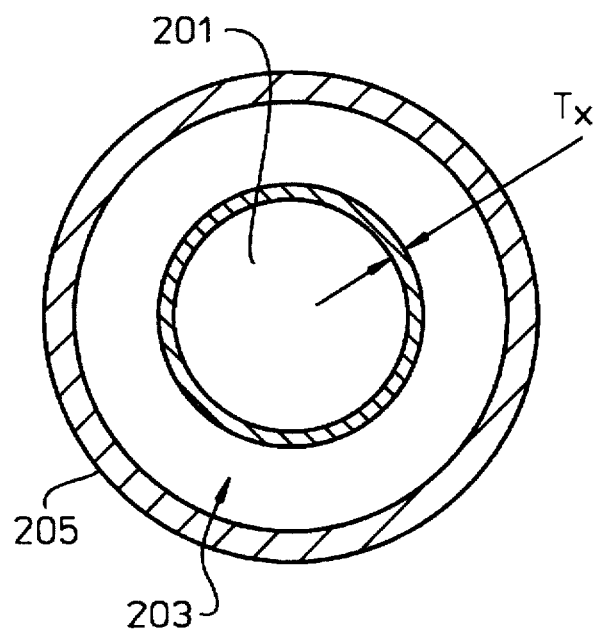

FIGS. 2A, 2B, and 2C show various views of a preferred microwave resonator of the invention including a resonant microwave cavity 201 having three mutually orthogonal dimensions and a low loss dielectric body 203 substantially enclosing each dimension of the resonant microwave cavity. For illustrative purposes only, an X, Y, and Z, cartesian axis is drawn to suggest the three mutually orthogonal dimensions of the cavity. Of course the three dimensions of the cavity remain mutually orthogonal and substantially enclosed by the body independent of any translation of the three dimensions. As another reference, the axes of a cylindrical co-ordinate system having height component, z, radial component, ρ, and angular component, φ, is also drawn.

FIG. 2A is an isometric view wherein a preferred metal housing 205 is shown as cut away to reveal the dielectric body 203. In the preferred embodiment shown in FIGS. 2A, 2B, and 2C, the dielectric body 203 includes a hollow spool shaped member. The hollow spool shaped member includes a hollow dielectric tube portion extending between first and second dielectric plate portions. Preferably, the plate portions and the tube portions of the body are machined separately. The tube portion is machined in segments, which are then stacked together with the plate portions to complete the dielectric body.

It is theorized that the ultimate Q-factor achievable for the resonator is dictated by the loss tangent of the dielectric material of the dielectric body. It is preferred that the dielectric material of dielectric body have low loss, in particular have a loss tangent lower than the relatively high loss tangent of $3.3 \times 10^{-4}$. For example very low loss tangents are found in materials such as monocrystaline sapphire or quartz. Monocrystaline sapphire has a loss tangent of approximately $9.7 \times 10^{-6}$ at a frequency of 13.2 Gigahertz and a temperature of three hundred degrees Kelvin. Monocrystaline sapphire also has a relatively low dielectric constant of approximately 9.4.

FIG. 2B is a vertical cross sectional view revealing the resonant cavity 201 substantially enclosed by the dielectric body 203. FIG. 2C is a horizontal cross sectional view further revealing the resonant cavity 201 substantially enclosed by the dielectric body 203. To help reduce modal degeneracies, it is preferred that the resonant microwave cavity is substantially cylindrical. However it should be understood that the invention is not strictly limited to cylindrical resonant microwave cavities since practicing the invention with cavities of other shapes, such as spherical or rectangular shapes, obtains beneficial results.

The preferred embodiment of invention further comprises the metal housing, shown as cut away in FIG. 2A, having an inner surface substantially enclosing the dielectric body. The inner surface of the metal housing is sufficiently spaced apart from the inner surface of the dielectric body so as to maintain location of the modal electric field nulls at the inner surface of the dielectric body. Accordingly, it is preferred that the metal housing is cylindrically shaped, in a larger manner than the inner surface of the dielectric body.

It should be understood that while a preferred embodiment is shown in various views in FIGS. 2A, 2B, and 2C, in general there is a diverse manifold of possible geometries for the resonator apparatus of the invention, which is multi-dimensional. To further increase Q-factor, other preferred embodiments of the invention includes a plurality of resonant microwave cavities arranged so that the low loss dielectric body substantially encloses each of the microwave resonant cavities. In some embodiments the resonant cavities are concentrically arranged. The low loss dielectric body has a plurality of inner surfaces that substantially define the plurality of resonant cavities. The plurality of resonant microwave cavities support a resonant mode of microwaves having modal electric field nulls. In accordance with the principles of the invention the inner surfaces of the low loss dielectric body are disposed at locations of the modal electric field nulls.

Rather than blindly calculating the modes and their attendant loss properties for arbitrary dimensions and dielectric placements, the design method of the invention provides reasonably simple design rules to limit the potential geometries. As explained in further detail later herein, derivation of the design rules is enabled by the approximate factorizability of eigenfunction solutions, which allows certain general design constraints to be placed independently on the tube portions and plates of the resonant apparatus of the invention.

In general, if Maxwell's equations are restricted to a subregion of uniform material properties, and it is assumed that the solution has harmonic time-dependence, all components of the electric and magnetic fields must satisfy the field equation.

$$(\nabla^2 + \mu\epsilon\omega^2)\begin{pmatrix} E \\ B \end{pmatrix} = 0$$

where $\nabla^2$ is the Laplacian operator, $\mu$ is the magnetic permeability of the subregion, $\epsilon$ is the electric permittivity of the subregion, $\omega$ is the harmonic angular frequency, $E$ is the electric field, and $B$ is the magnetic field.

For the purposes of this discussion, a cylindrical co-ordinate system having height component, $z$, radial component, $\rho$, and azimuthal angular component, $\phi$, will be used. However, those with ordinary skill in the art will appreciate general applicability of this discussion to other co-ordinate systems. Assuming no azimuthal dependence for fields and given $\epsilon_0$ as the electric permittivity of a vacuum, Maxwell's equations in cylindrical coordinates give the following relations for the individual field components within a region having magnetic permeability $\mu_0$, and relative electric permittivity $\epsilon_r$:

$$\frac{\partial B_\rho}{\partial z} + i\omega\epsilon_0\mu_0\epsilon_r E_\phi = \frac{\partial B_z}{\partial \rho}$$

$$\frac{\partial E_\phi}{\partial z} + i\omega B_\rho = 0$$

-continued $$E_\phi + \rho\frac{\partial E_\phi}{\partial \rho} = i\omega\rho B_z$$

$$\frac{\partial B_\phi}{\partial z} - i\omega\epsilon_0\mu_0\epsilon_r E_\rho = 0$$

$$B_\phi + \rho\frac{\partial B_\phi}{\partial \rho} = -i\omega\epsilon_0\mu_0\epsilon_r \rho E_z$$

$$\frac{\partial E_\rho}{\partial z} - i\omega B_\phi = \frac{\partial E_z}{\partial \rho}$$

It should be noted that as written herein the field components $B_\rho$, $B_z$, $E_\phi$ are de-coupled from $B_\phi$, $E_\rho$, $E_z$ for the above assumed conditions into the usual Transverse Electric (TE) and Transverse Magnetic (TM) mode designations respectively. It should be further noted that the TE fields can be derived from the $B_z$ component, and the TM fields from the $E_z$ component using the above equations.

Restricting discussion now to TE modes, and the previously discussed dielectric plate and tube portions of one or more dielectric bodies, the determining equation becomes $$\left(\nabla^2 + \epsilon_r(\rho,z)\frac{\omega^2}{c^2}\right) B_z(\rho,z) = 0$$

where the dielectric function is given by:

$$\epsilon_r(\rho,z) = 1 + (\epsilon_d - 1)[f_1(\rho) + f_2(z) - f_1(\rho)f_2(z)]$$

$f_1$ having a value of one for $\rho$ inside a dielectric tube portion and having a value of zero otherwise, $f_2$ having a value of one for $z$ inside a dielectric plate portion and having a value of zero otherwise, and $\epsilon_d$ is the relative electric permittivity of the dielectric material, preferably monocrystaline sapphire. It should be noted that this partial differential equation is not separable due to the product term $f_1 f_2$ in the expression for the dielectric function.

A key theoretical principle of the invention is that $f_1$ and $f_2$ are only non-zero over very small ranges of $\rho$ and $z$ respectively, and therefore the product term $f_1 f_2$ is negligible to a very good approximation in calculation of the eigenmodes of the system. Validity of this approximation is born out by perturbative calculations described in an appendix included later herein. Therefore, utilizing the approximation, the product term in the dielectric function is ignored so that the partial differential equation becomes separable, and takes the form:

$$\left[\frac{d^2}{d\rho^2} + \frac{1}{\rho}\frac{d}{d\rho} + k_0^2(1 + (\epsilon_d - 1)f_1(\rho)) - \lambda\right] R(\rho) = 0$$

$$\left[\frac{d^2}{dz^2} + k_0^2(\epsilon_d - 1)f_2(z) + \lambda\right] Z(z) = 0$$

where $\lambda$ is the to-be-determined separation constant, $k_0 = \omega/c$, where $c$ is the speed of light, and $B_z(\rho, z)$ is separated as a product of functions of $\rho$ and $z$ separately, $R(\rho)Z(z)$. These equations are solved in each region of uniform dielectric constant:

$$R_n(\rho) = A_n J_0(\sqrt{\lambda_n}\ \rho) + B_n Y_0(\sqrt{\lambda_n}\ \rho)$$

$$Z_n(z) = C_n \cos(\sqrt{\eta_n}\ z) + D_n \sin(\sqrt{\eta_n}\ z)$$

-continued where $$\lambda_n = k_0^2(1 + (\epsilon_d - 1)f_r(\rho)) - \lambda$$

$$\eta_n = K_0^2(\epsilon_d - 1)f_z(z) + \lambda$$

and "n" denotes the specific geometrical region. Since the full field expression can be factorized into product field functions, the problem is solved as two separate effective one-dimensional boundary-value problems, coupled by the separation constant $\lambda$. The coefficients $(A_n, B_n)_{n>0}$ are determined from $(A_0, B_0)$ by matching the tangential E and H fields across each intermediate dielectric discontinuity (radial interface). This procedure is implemented by concatenating 2×2 matrices that connect coefficients across each dielectric interface. A similar process is followed for the coefficients $(C_n, D_n)_{n>0}$. Eigenfrequencies of the matrices are determined in accordance with the principles of the invention by varying $\omega$ and the separation constant $\lambda$ in such a way that the tangential E-fields on the metal housing vanish. The electric and magnetic fields for the specified mode are then determined from the product function and the relations described previously herein. The mode losses and resultant Q-factor can then be determined from the calculated fields.

To provide further understanding of the invention, the electromagnetic solutions are discussed further herein in terms of wave scattering. The field equation in the transverse $\rho$-dimension of the cylindrical co-ordinate system is as follows:

$$\left[ \frac{d^2}{d\rho^2} + \frac{1}{\rho} \frac{d}{d\rho} + k_0^2(1 + (\epsilon_d - 1)f_1(\rho)) - \lambda \right] R(\rho) = 0.$$

The solutions desired for present purposes are those that represent waves which are propagating and scattering off of a single dielectric tube portion, rather than the usual standing wave Bessel functions used in determination of the resonant modes. These traveling wave solutions are the Hankel functions of the first and second kind $$H_0^{(1)}(x) = J_0(x) + iY_0(x)$$

$$H_0^{(2)}(x) = J_0(x) - iY_0(x)$$

where the first solution represents an outgoing cylindrical wave, and the second represents an in-going cylindrical wave. These solutions can be used to study the scattering of a cylindrical wave originating from the origin at $\rho=0$ and scattering from a single dielectric tube portion of thickness t at $\rho=D$. The solution inside the tube portion is given by $$R_{in}(\rho) = H_0^{(1)}(\sqrt{\eta} \rho) + RH_0^{(2)}(\sqrt{\eta} \rho)$$

and the solution outside the tube portion is given by $$R_{out}(\rho) = TH_0^{(1)}(\sqrt{\eta} \rho)$$

where R and T are reflection and transmission coefficients respectively, and $\eta$ is a constant determined from the above differential equation. Matching the tangential fields (E and H) across the dielectric interfaces allows analytic expressions for R and T. The following results are obtained:

(1) The reflectively is a maximum for tube portion wall thicknesses equal to integer multiples of one quarter of a ratio of two pi over the radial wave number of the resonant mode in the dielectric, with reflection magnitude being substantially determined by dielectric constant mismatch between the interior surface of the tube portion of body and regions of air or vacuum adjacent thereto. A somewhat surprising principle of the invention is that this is analogous to plane wave scattering from a flat dielectric sheet.

(2) The phase shift of the reflection coefficient R is zero for the tube portion thicknesses described in result (1).

These two results lead to the following simple design rules:

(1) To maximize reflectivity, tube portion wall thickness is preferably chosen to be an integer multiple of one quarter of a ratio of two pi over the radial wave number of the resonant mode in the dielectric;

(2) To have a resonant mode, the phase shift of a propagating wave from the origin $\rho=0$ out to the front edge of the reflector and back again must be an integer multiple of $2\pi$. Given the phase shift of scattering from the dielectric tube portion, and the fact that the phase of the Hankel functions has the simple form $$\text{phase}(H_n^{(1)}(x)) = \text{atan}\left( \frac{J_n(x)}{Y_n(x)} \right)$$

implies that the inner surface of the dielectric tube portions must be placed at the field nulls of the electric field for the constructive interference required by the resonance condition.

Similar results can be derived for the simpler case of the z-dimension dynamics. Here the problem is to analyze plane waves scattering from a flat dielectric plate. The results follow from the well known Fresnel relations of electromagnetism. The design constraints then become similar to the above: to maximize reflectivity the flat plates preferably have thickness substantially equal to integer multiples of one quarter of a ratio of two pi over the axial wave number of the resonant mode in the dielectric. Preferably, the inner surfaces of the plates are placed at nulls of the electric field solutions, which have a trigonometric dependence in the z-dimension.

In summary, the design method of the invention includes selecting a resonant mode frequency and a height dimension of a microwave resonant cavity. The method further includes extending radial bessel function solutions along the radial dimension of the cavity to determine radial locations of electric field nulls of a resonant mode of microwaves, and substantially positioning concentric dielectric tube portions at the radial locations of the electric field nulls. Similarly, the method of the invention includes extending cavity harmonic function solutions along the axis of symmetry of the cavity to determine axial locations of electric field nulls of the resonant mode of microwaves and substantially positioning dielectric plates at the axial locations of the electric field nulls. Adjustments are made as needed to compensate for any phase shifts through any interior dielectric members.

For example, as particularly shown in FIG. 2B, the resonant microwave cavity has a height dimension, $H_1$, defined by a separation of the first and second plate portions of the dielectric body. In accordance with the design method discussed in detail previously herein, dimensions of the cavity within the dielectric body of the invention are selected based on the desired microwave resonant frequency using techniques known to those with ordinary skill in the art, such as techniques discussed in chapter 8.7 of "Classical Electrodynamics", by J. D. Jackson, John Wiley and Sons (1975), pp. 353–356, which is incorporated herein by reference.

The first and second dielectric plate portions of the body each have a thickness dimension, $T_p$, substantially corresponding to an integral multiple of one quarter of a ratio of two pi over the axial wave number of the resonant mode in the dielectric. Furthermore, as particularly shown in FIG. 2C, the tube portion of the body includes a tube wall having a thickness dimension, $T_w$, substantially corresponding to an integer multiple of one quarter of a ratio of two pi over the radial wave number of the resonant mode in the dielectric.

As shown in FIG. 2B, the resonant cavity has a diameter, $D_1$, defined by the diameter of the tube portion of the dielectric body. Preferably, the first and second plate portions each have diameters, $D_E$, substantially larger than the diameter, $D_1$, of the hollow dielectric tube portion. The metal housing has a diameter, $D_E$, defined by the diameter of the disk portions of the dielectric body. The metal housing has a height dimension, $H_E$, defined by the height of the tube portion of the dielectric body.

Figure 3:
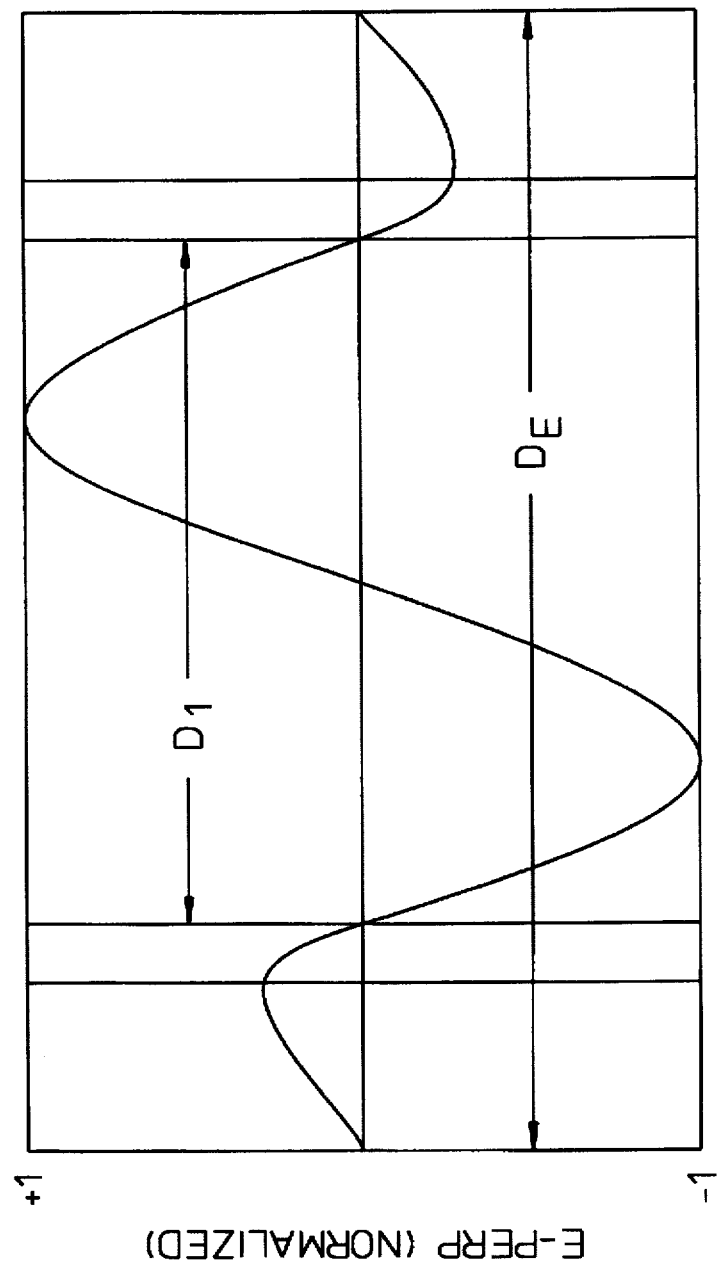
FIG. 3 is a diagram showing normalized perpendicular electric field component of the resonant mode versus radial position within the preferred embodiment of FIGS. 2A–2C.

The resonant microwave cavity supports a resonant mode of microwaves having modal electric field nulls. In accordance with the principles of the invention, the low loss dielectric body has an inner surface disposed at locations of the modal electric field nulls. Using the design method of the invention, this is achieved by extending radial bessel function solutions along a radius of the cavity to determine radial locations of electric field nulls of a resonant mode of microwaves. FIG. 3 is a diagram showing normalized perpendicular electric field component of the resonant mode versus radial position within the preferred embodiment of FIGS. 2A-2C, illustrating that the diameter of the tube portion, $D_1$, is selected in accordance with the design method so that the tube portion of the dielectric body is substantially positioned at the radial location of an electric field null.

Of course, because of boundary conditions imposed by the metal housing, there are additional modal electric field nulls located at the inner surface of the metal housing, as illustrated in FIG. 3. By suitably selecting the diameter of the metal housing, $D_E$, the inner surface of the metal housing is sufficiently spaced apart from the inner surface of the dielectric body so as to maintain the location of an electric field null at the inner surface of the dielectric body as shown in FIG. 3.

Similarly, using the design method of the invention, cavity harmonic function solutions are extended along the axis of symmetry of the cavity to determine axial locations of electric field nulls of the resonant mode of microwaves, and dielectric plates are positioned at the axial locations of the electric field nulls. By suitably selecting the height of the metal housing, $H_E$, the inner surface of the metal housing is sufficiently spaced apart from the inner surface of the dielectric body so as to maintain location of the modal electric field nulls at the inner surface of the dielectric body.

The invention provides for resonators operating at microwave frequencies, which extend from approximately 0.5 Gigahertz to well past approximately 500 Gigahertz. As a more detailed example in accordance with the design method of the invention, given a desired resonant frequency of 13.20 Gigahertz, a monocrystaline sapphire dielectric body, and the design shown in FIGS. 2A through 2C and discussed in detail previously herein, the invention provides that:

the resonant microwave cavity has a height dimension, $H_1$, measuring 26 millimeters (mm), defined by the separation of the first and second plate portions of the dielectric body;

the first and second dielectric plate portions of the body each have a respective thickness dimension, $T_p$, measuring 1.94 mm;

the resonant cavity has a diameter, $D_1$, measuring 30.8 mm, defined by the diameter of the tube portion of the dielectric body;

the tube portion of the body includes a tube wall having a thickness dimension, $T_w$, measuring 1.87 mm the metal housing has a diameter, $D_E$, measuring 47.5 mm defined by the diameter of the disk portions of the dielectric body; and the metal housing has a height dimension, $H_E$, measuring 55.9 mm, defined by the height of the tube portion of the dielectric body.

The results of this example are summarized in Table 1:

| FIGS. 2A-2C design | $Q_0$ (Q Factor) | F (Frequency) |
|---|---|---|
| Computed | 285,000 | 13.20 Gigahertz |

Computed results are created using simulation models well known to those with ordinary skill in the art, which are known to track very closely with actual experimental results. As summarized in Table 1, using the simple design of the invention as shown in FIGS. 2A-2C achieves unexpected, superior results of an extraordinarily high Q Factor, which is close to nineteen times higher than a traditional metallic cavity resonator, and which is close to ten times higher than a modified metallic cavity resonator as taught in "New concept for low-loss microwave devices" by Comte et al., Electronics Letters Vol. 30 No. 5, pp 419 and 420.

To further increase Q-factor, the apparatus of the invention preferably includes a plurality of resonant microwave cavities arranged so that the low loss dielectric body substantially encloses each of the microwave resonant cavities. In some embodiments the resonant cavities are concentrically arranged. The low loss dielectric body has a plurality of inner surfaces that substantially define the plurality of resonant cavities. The plurality of resonant microwave cavities support a resonant mode of microwaves having modal electric field nulls. In accordance with the principles of the invention the inner surfaces of the low loss dielectric body are disposed at locations of the modal electric field nulls.

Figure 4A:
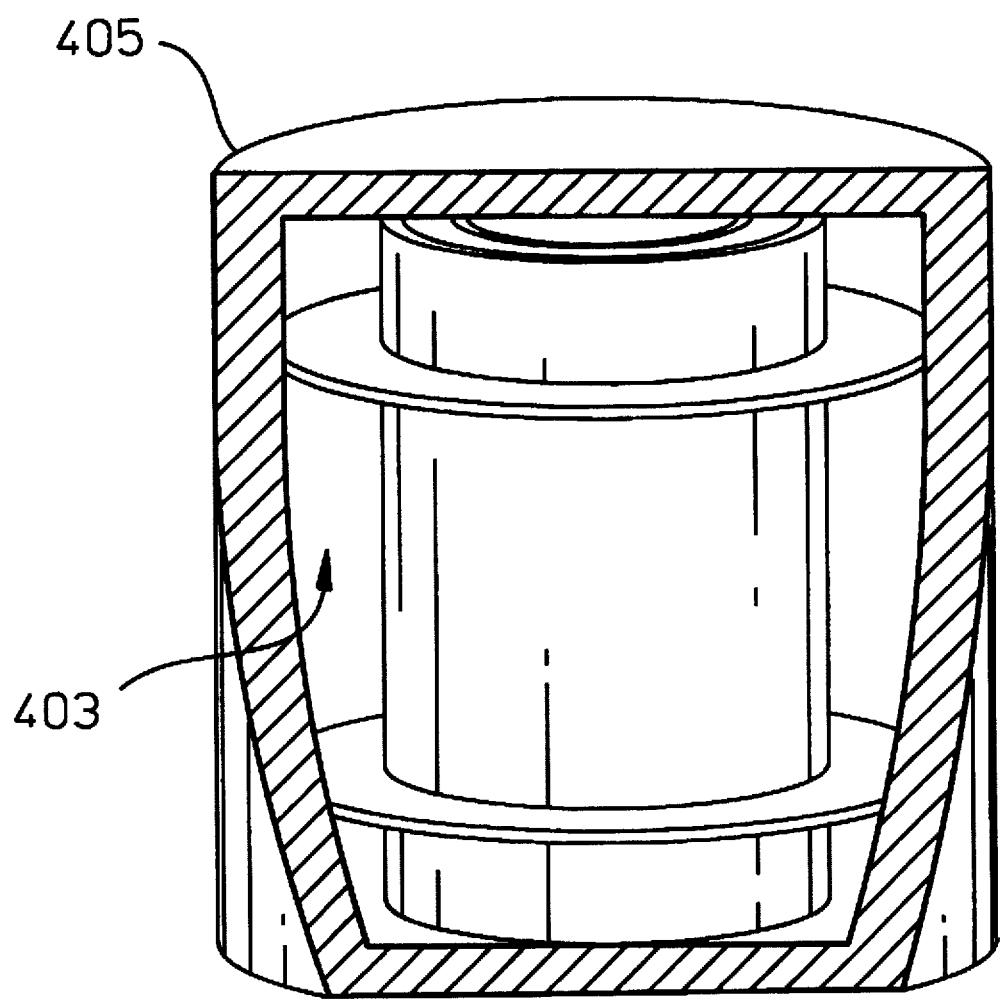
FIGS. 4A, 4B, and 4C show various views of another preferred embodiment of the apparatus of the invention.
Figure 4B:
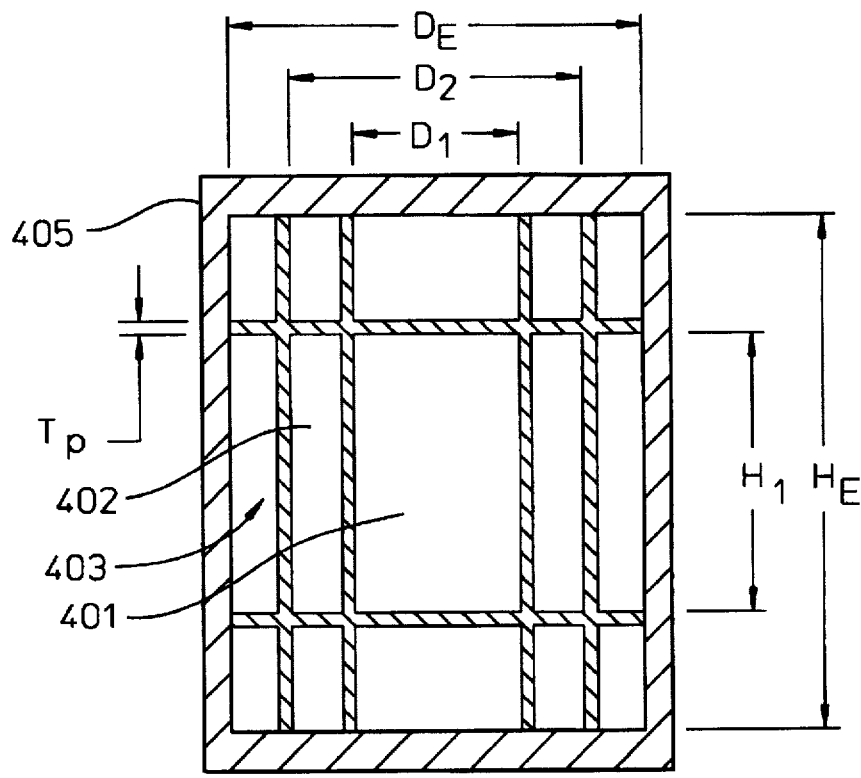
Figure 4C:
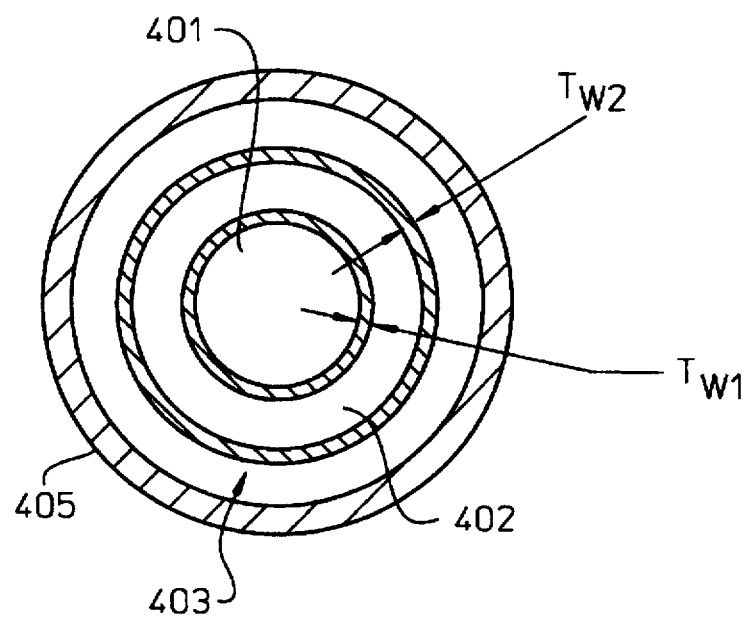

For example, FIGS. 4A, 4B, and 4C show various views of another preferred microwave resonator of the invention including a resonant microwave cavity 401 having three mutually orthogonal dimensions and a low loss dielectric body 403 substantially enclosing each dimension of the resonant microwave cavity. As shown, the first microwave resonant cavity is concentrically disposed within a second microwave resonant cavity 402. Accordingly, the second microwave resonant cavity concentrically overlaps the first microwave resonant cavity. The first and second resonant microwave cavities support a resonant mode of microwaves spanning the first and second resonant microwave cavities.

FIG. 4A is an isometric view wherein a preferred metal housing 405 is shown as cut away to reveal the dielectric body 403. In the embodiment shown in FIGS. 4A, 4B, and 4C, the dielectric body 403 includes a first hollow dielectric tube portion extending between first and second dielectric plate portions. The low loss dielectric body further includes a second tube portion concentrically arranged adjacent to the first tube portion of the body. Just as the first tube portion substantially encloses the first microwave resonant cavity, the second tube portion substantially encloses the second microwave resonant cavity.

The first and second tube portions each have a respective inner surface. The first and second resonant microwave cavities support a resonant mode of microwaves having modal electric field nulls. The respective inner surface of each of the first and second tube portions are disposed at locations of the modal electric field nulls. Similarly, a respective adjacent surface of each of the plates is also disposed at the electric field nulls.

FIG. 4B is a vertical cross sectional view revealing the first resonant cavity 401 and the second resonant cavity 402, which are substantially enclosed by the dielectric body 403. FIG. 4C is a horizontal cross sectional view further revealing the first resonant cavity 401 and the second resonant cavity 402 substantially enclosed by the dielectric body 403.

The preferred embodiment of invention further comprises the metal housing, shown as cut away in FIG. 4A, having an inner surface substantially enclosing the dielectric body. The inner surface of the metal housing is sufficiently spaced apart from the inner surface of the dielectric body so as to maintain location of the modal electric field nulls at the inner surface of the dielectric body.

As particularly shown in FIG. 4B, the first and second resonant microwave cavities each have a height dimension, $H_1$, defined by a separation of the first and second plate portions of the dielectric body. In accordance with the design method discussed in detail previously herein, dimensions of the cavity within the dielectric body of the invention are selected based on the desired microwave resonant frequency using techniques known to those with ordinary skill in the art.

The first and second dielectric plate portions of the body each have a thickness dimension, $T_p$, substantially corresponding to an integral multiple of one quarter of a ratio of two pi over the axial wave number of the resonant mode in the dielectric. Furthermore, as particularly shown in FIG. 4C, the first and second tube portions of the body each include a respective tube wall having respective thickness dimensions, $T_{W1}$, $T_{W2}$, substantially corresponding to an integral multiple of one quarter of a ratio of two pi over the radial wave number of the resonant mode in the dielectric.

As shown in FIG. 4B, the first resonant cavity has a diameter, $D_1$, defined by the diameter of the first tube portion of the dielectric body. Similarly, the second resonant cavity has a diameter, $D_2$, defined by the diameter of the second tube portion of the dielectric body. Preferably, the first and second plate portions each have diameters, $D_E$, substantially larger than the diameters, $D_1$, $D_2$, of the first and second hollow dielectric tube portions. The metal housing has a diameter, $D_E$, defined by the diameter of the disk portions of the dielectric body. The metal housing has a height dimension, $H_E$, defined by the height of the first and second tube portions of the dielectric body.

The resonant microwave cavities support a resonant mode of microwaves having modal electric field nulls. In accordance with the principles of the invention, the low loss dielectric body has an inner surface disposed at locations of the modal electric field nulls. Using the design method of the invention, this is achieved by extending radial bessel function solutions along a radius of the cavity to determine radial locations of electric field nulls of a resonant mode of microwaves.

Figure 5:
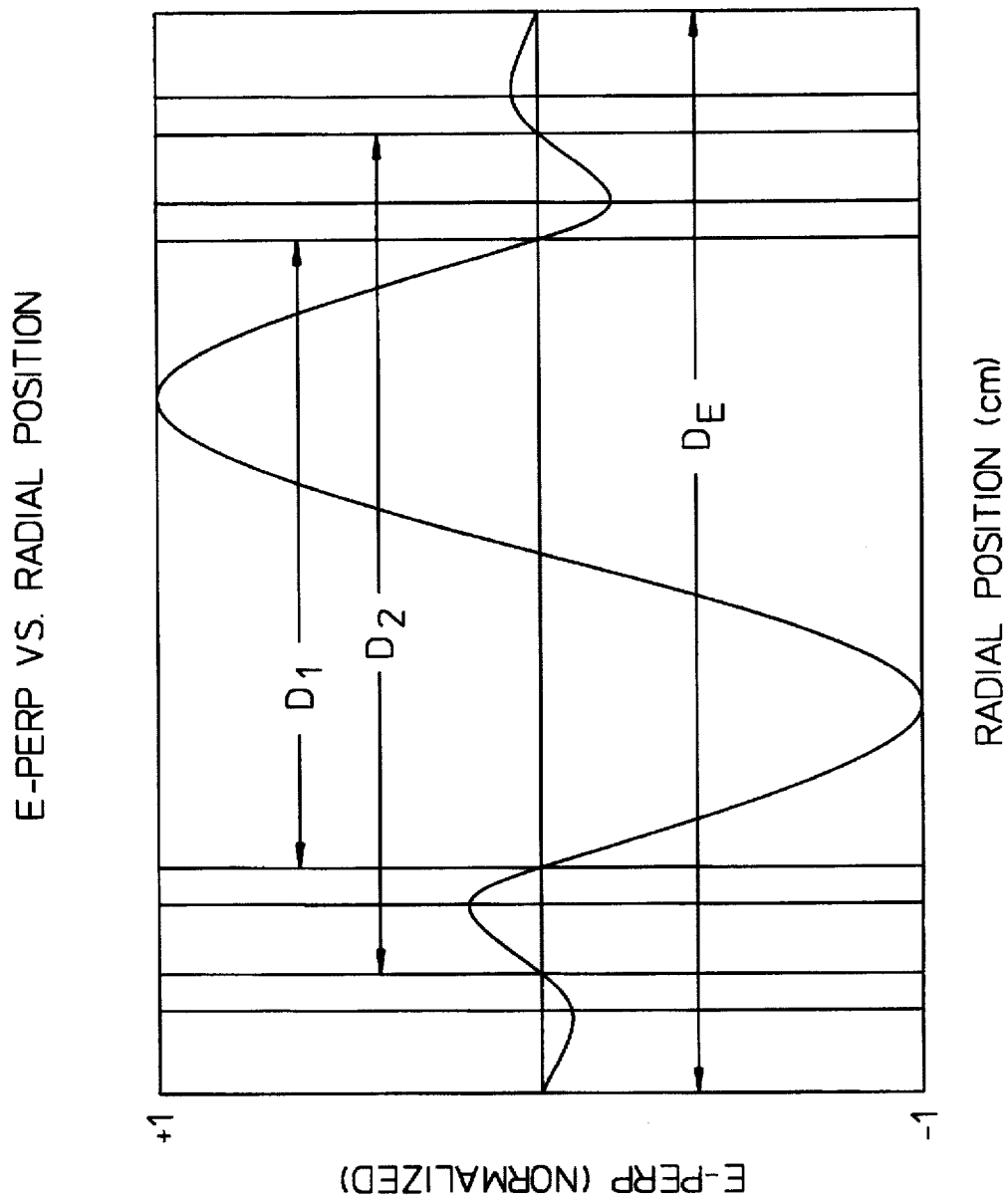
FIG. 5 is a diagram showing normalized perpendicular electric field component of the resonant mode versus radial position within the preferred embodiment of FIGS. 4A–4C.

FIG. 5 is a diagram showing the normalized perpendicular electric field component of the resonant mode versus radial position within the preferred embodiment of FIGS. 4A–4C, illustrating that the diameter of the first tube portion, $D_1$, is selected in accordance with the design method so that the first tube portion of the dielectric body is substantially positioned at the radial location of an electric field null. Similarly the diameter of the second tube portion, $D_2$, is selected in accordance with the design method so that the second tube portion of the dielectric body is substantially positioned at an additional radial location of an electric field null.

Of course, because of boundary conditions imposed by the metal housing, there is another additional modal electric field null located at the inner surface of the metal housing, as illustrated in FIG. 5. By suitably selecting the diameter of the metal housing, $D_E$, the inner surface of the metal housing is sufficiently spaced apart from the inner surface of the dielectric body so as to maintain location of the modal electric field nulls at the inner surfaces of the dielectric body as shown in FIG. 5.

Similarly, using the design method of the invention, cavity harmonic function solutions are extended along the axis of symmetry of the cavity to determine axial locations of electric field nulls of the resonant mode of microwaves, and dielectric plates are positioned at the axial locations of the electric field nulls. By suitably selecting the height of the metal housing, $H_E$, the inner surface of the metal housing is sufficiently spaced apart from the inner surface of the dielectric body so as to maintain location of the modal electric field nulls at the inner surfaces of the dielectric body.

As another detailed example in accordance with the design method of the invention, given a desired resonant frequency of 13.20 Gigahertz, a monocrystaline sapphire dielectric body, and the design shown in FIGS. 4A through 4C and discussed in detail previously herein, the invention provides that:

- the resonant microwave cavity has a height dimension, $H_1$, measuring 26 millimeters (mm), defined by the separation of the first and second plate portions of the dielectric body;
- the first and second dielectric plate portions of the body each have a respective thickness dimension, $T_p$, measuring 1.94 mm;
- the first resonant cavity has a diameter, $D_1$, measuring 30.8 mm, defined by the diameter of the first tube portion of the dielectric body;
- the second resonant cavity has a diameter, $D_2$, measuring 47.5 mm, defined by the diameter of the second tube portion of the dielectric body;
- the first and second tube portions of the body each include a respective tube wall having respective thickness dimensions, $T_{W1}$, $T_{W2}$, each measuring 1.87 mm
- the metal housing has a diameter, $D_E$, measuring 64.0 mm defined by the diameter of the disk portions of the dielectric body; and
- the metal housing has a height dimension, $H_E$, measuring 55.9 mm, defined by the height of the tube portion of the dielectric body.

The results of this example are summarized in Table 2:

| FIGS. 4A–4C design | $Q_0$ (Q Factor) | F (Frequency) |
| --- | --- | --- |
| Computed | 650,000 | 13.20 Gigahertz |

Computed results are created using simulation models well known to those with ordinary skill in the art, which are known to track very closely with actual experimental results. As summarized in Table 2, using the simple design of the invention as shown in FIGS. 4A–4C achieves unexpected, superior results of an extraordinarily high Q Factor, which is far higher than that of resonators known in the prior art.

Figure 6A:
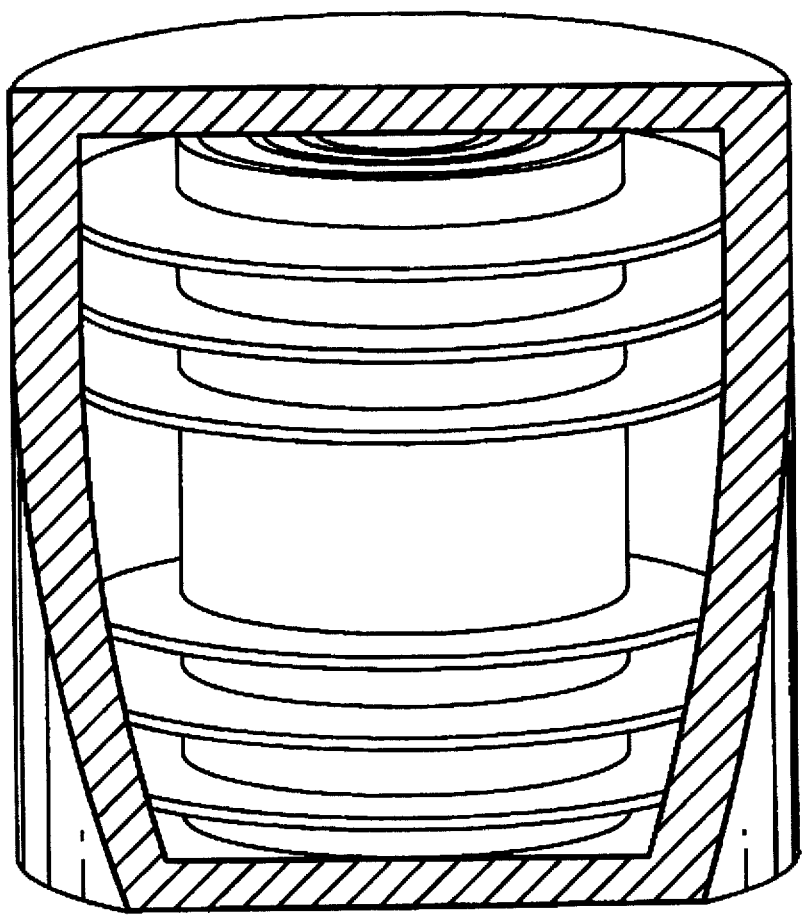
FIGS. 6A, 6B, and 6C show various views of yet another preferred embodiment of the apparatus of the invention.
Figure 6B:
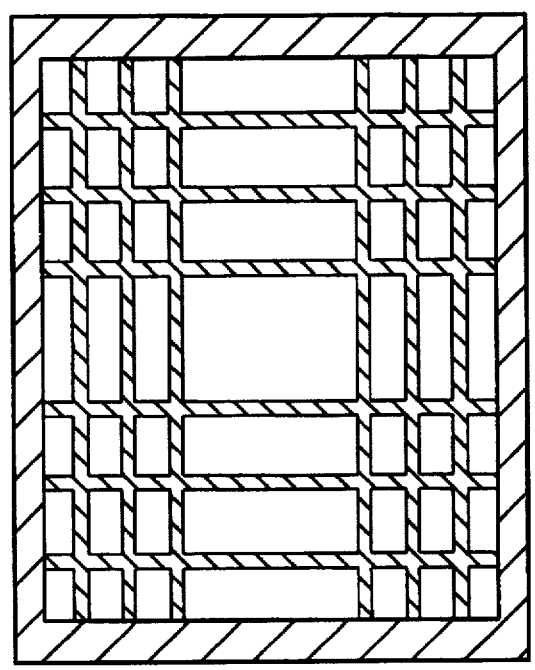
Figure 6C:
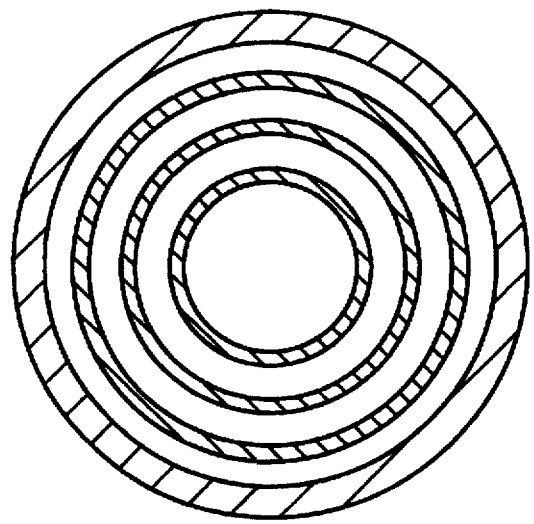

FIGS. 6A, 6B, and 6C show various views of yet another preferred microwave resonator of the invention, which includes a plurality of resonant microwave cavities arranged so that a low loss dielectric body substantially encloses each of the microwave resonant cavities. The resonant microwave cavities support a resonant mode of microwaves spanning the resonant microwave cavities. As complexity of the dielectric body increases, Q factor of the resonator increases. Accordingly, there is a design trade off between complexity and Q factor.

FIG. 6A is an isometric view wherein a preferred metal housing is shown as cut away to reveal the dielectric body. In the embodiment shown in FIGS. 6A, 6B, and 6C, the dielectric body includes a first dielectric tube portion, a second dielectric tube portion, and a third dielectric tube portion, which are concentrically arranged. The tube portions extend between a first pair of dielectric plates, a second pair of dielectric plates, and a third pair of dielectric plates, that are all parallel.

The first, second, and third tube portions each have a respective inner surface. The resonant microwave cavities support a resonant mode of microwaves having modal electric field nulls. The respective inner surface of each of the first, second, and third tube portions are disposed at locations of the modal electric field nulls. Similarly a respective adjacent surface of each of the plates is disposed at locations of the electric field nulls.

FIG. 6B is a vertical cross sectional view revealing the resonant cavities, which are substantially enclosed by the dielectric body. FIG. 6C is a horizontal cross sectional view further revealing the resonant cavities, which are substantially enclosed by the dielectric body. The preferred embodiment of invention further comprises the metal housing, shown as cut away in FIG. 6A, having an inner surface substantially enclosing the dielectric body. The inner surface of the metal housing is sufficiently spaced apart from the inner surface of the dielectric body so as to maintain location of the modal electric field nulls at the inner surfaces of the dielectric body.

Figure 7A:
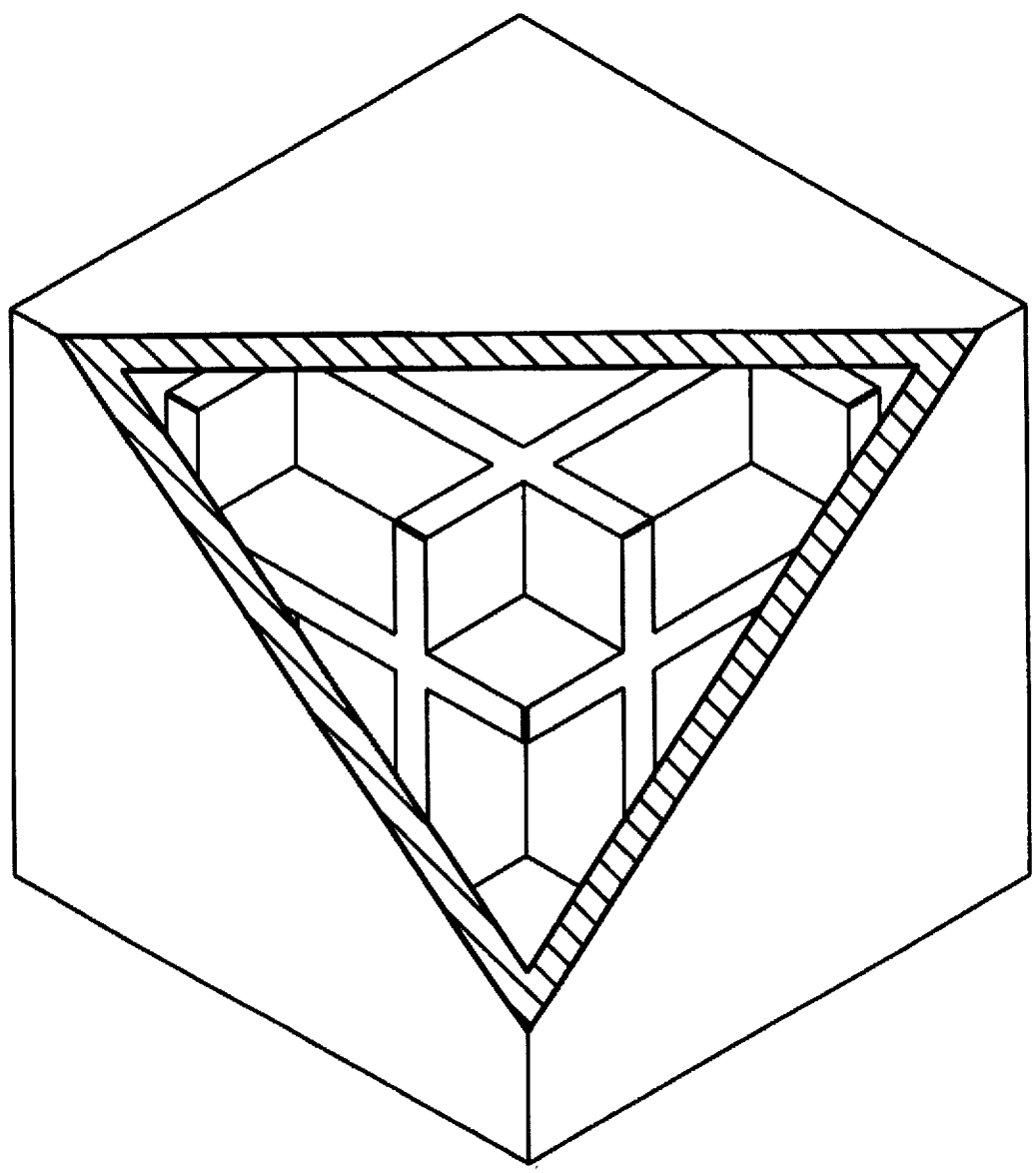
FIGS. 7A, 7B, and 7C show various views an alternative embodiment of the apparatus of the invention.
Figure 7B:
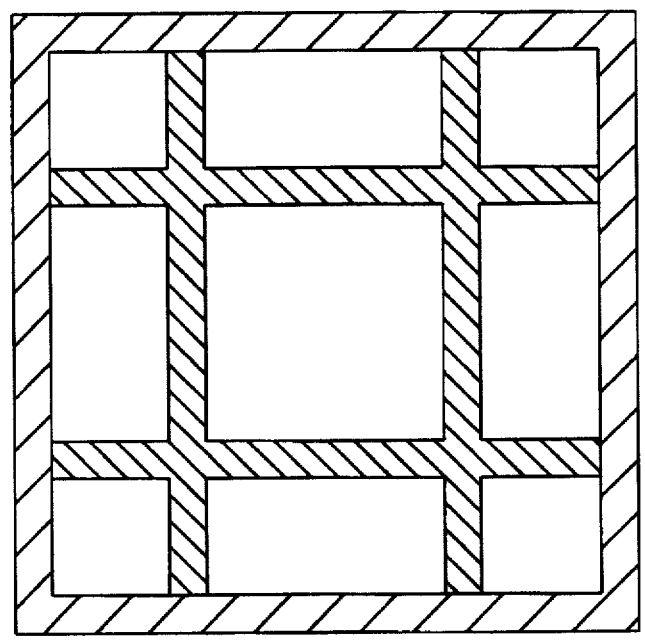
Figure 7C:
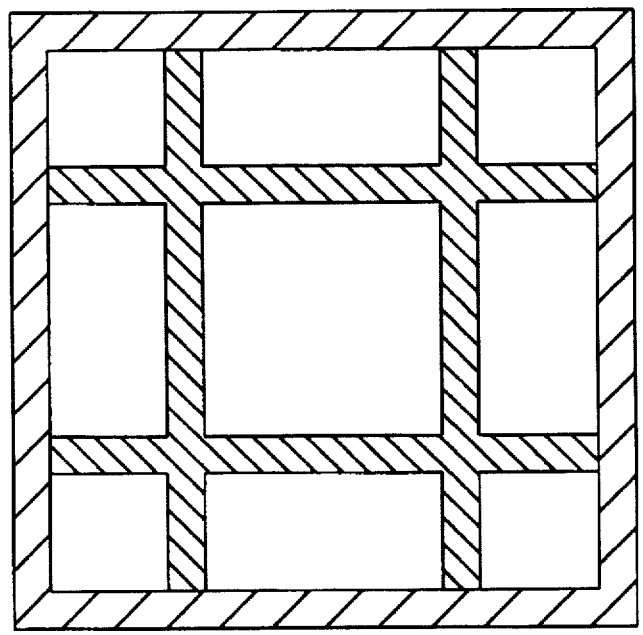

FIGS. 7A, 7B, and 7C are various views of an alternative embodiment of the microwave resonator of the invention, including a rectangular resonant microwave cavity having three mutually orthogonal dimensions and a low loss dielectric body substantially enclosing each dimension of the resonant microwave cavity. FIG. 7A is an isometric view wherein a preferred metal housing is shown as cut away to reveal the dielectric body. FIGS. 7B and 7C are cross sectional views revealing the resonant cavity. To construct the alternative embodiment shown in the figures, the design method discussed in detail previously herein is adapted for rectangular coordinates.

The present invention provides a simplified apparatus and a design method for providing microwave resonators having Q factors far higher than those known in the prior art. Although specific embodiments of the invention have been described and illustrated, the invention is not to be limited to the specific forms or arrangements of parts so described and illustrated, and various modifications and changes can be made without departing from the scope and spirit of the invention. Within the scope of the appended claims, therefore, the invention may be practiced otherwise than as specifically described and illustrated.

Appendix

Validity of "separable approximation"

Previously herein, field equations were solved within a specified approximate framework. The approximation was to ignore the product term in the dielectric function, allowing the field equations to become completely separable. This was assumed to be an excellent approximation, since the neglected term was non-zero over an extremely small geometrical region, and this region contained very weak fields as well. In order to justify this procedure quantitatively, a perturbative expansion will be performed, and the contribution of the neglected term shown to be negligible.

The approximate equation has the form $$\left( \nabla^2 + \epsilon_r^{(0)}(\rho,z) \frac{\omega^2}{c^2} \right) B_z(\rho,z) = 0$$

where $$\epsilon_r^{(0)}(\rho,z) = 1 + (\epsilon_d - 1)[f_1(\rho) + f_2(z)].$$

The neglected term is a contribution to the dielectric function of the form $$\Delta\epsilon_r(\rho,z) = -(\epsilon_d - 1) f_1(\rho) f_2(z).$$

Analysis of this is a straightforward application of perturbation theory of the Sturm-Liouville equation. The general problem has the structure $$L^{(0)} u_n^{(0)} = \lambda_n^{(0)} W u_n^{(0)}$$

where $L^{(0)}$ is a self-adjoint operator, W is a generalized weighting function, $\lambda_n^{(0)}$ are the unperturbed eigenvalues, and $u_n^{(0)}$ are the unperturbed eigenfunctions. If one defines a perturbed operator $$L = L^{(0)} + Q$$

where Q is the perturbation term, the full solution is governed by the equation $$L u_n = \lambda_n W u_n.$$

These eigenfunctions and eigenvalues can be expanded in a perturbative expansion in the unperturbed quantities $$\lambda_n = \lambda_n^{(0)} + \lambda_n^{(1)} + \lambda_n^{(2)} + \ldots$$

$$u_n + u_n^{(0)} + \sum_m a_{nm}^{(1)} u_m^{(0)} + \sum_m a_{nm}^{(2)} u_m^{(0)} + \ldots$$

where the superscript denotes the order of the term in the perturbing quantity Q. Matching terms of the same order in the perturbation yields expressions for the coefficients of the expansion. To first order, the correction to the eigenvalue is given by $$\lambda_n^{(1)} = \langle u_n^{(0)} | Q | u_n^{(0)} \rangle.$$

and the coefficients for the first order corrections to the eigenfunctions are given by $$a_{np}^{(1)} = \frac{\langle u_p^{(0)} | Q | u_n^{(0)} \rangle}{\lambda_n^{(0)} - \lambda_p^{(0)}}.$$

Direct application of these formulas to the problem defined at the beginning of this section yields the following expression for the corrected eigenfrequency $$v = v_0 \left(1 + \frac{1}{2} (\epsilon_d - 1) \overline{<u_n^{(0)} u_n^{(0)}>} + \ldots \right)$$

where the "bar" over the normalized overlap integral indicates that the volume of integration is restricted to the region where the perturbation is nonzero, and $v_0$ is the unperturbed eigenfrequency It is also straightforward to show that the expression for the coefficients of the eigenfunction corrections have the specific form $$d_{mp}^{(1)} = \frac{(\epsilon_d - 1)}{1 - (v_p/v_n)^2} \overline{<u_p^{(0)} u_n^{(0)}>}$$

and the corrected fields have the form $$(\vec{B})_n = (\vec{B}^{(0)})_n + \sum_p d_{mp}^{(1)} (\vec{B}^{(0)})_p$$

$$(\vec{E})_n = (\vec{E}^{(0)})_n + \sum_p d_{mp}^{(1)} (\vec{E}^{(0)})_p.$$

It should be noted that the cylindrical symmetry of the perturbation Q restricts the mixing of eigenmodes to within each TE and TM subset respectively, Evaluation of these formulas for typical geometries described previously herein yields fractional corrections to the unperturbed frequencies on the order of $1 \times 10^{-3}$, and fractional corrections to the unperturbed Q-values on the order of $5 \times 10^{-3}$. These results clearly verify that the approximation used previously herein to allow partial differential equation separability is an extremely good one.

What is claimed is:

1. An apparatus comprising:
    a first resonant microwave cavity having three mutually orthogonal dimensions; and
    a low loss dielectric body substantially enclosing each dimension of the first resonant microwave cavity, wherein:
        the resonant microwave cavity supports a resonant mode of microwaves having modal electric field nulls; and
        each of the dimensions of the resonant microwave cavity extend proximate to locations of the modal electric field nulls.

2. An apparatus as in claim 1 wherein:
    the low loss dielectric body has an inner surface; and
    the inner surface of the low loss dielectric body is disposed proximate to locations of the modal electric field nulls.

3. An apparatus as in claim 2 further comprising a metal housing substantially enclosing the dielectric body, the metal housing being sufficiently spaced apart from the dielectric body so as to maintain location of the modal electric field nulls proximate to the inner surface of the low loss dielectric body.

4. An apparatus as in claim 1 wherein the body comprises a first dielectric plate portion located proximate to a first extremity of the body, a second dielectric plate portion located proximate to an opposing extremity of the body, and a dielectric tube portion extending between the extremities of the body.

5. An apparatus as in claim 4 wherein:
    the resonant microwave cavity and the dielectric body support a resonant mode of microwaves; and
    the dielectric tube portion of the body includes a tube wall having a thickness dimension approximately equal to an integral multiple of one quarter of a ratio of two pi over a radial wave number of the resonant mode in the dielectric.

6. An apparatus as in claim 1 wherein the low loss dielectric body includes a first dielectric tube portion and further includes a second dielectric tube portion concentrically arranged adjacent to the first dielectric tube portion of the body.

7. An apparatus as in claim 7 wherein:
    the first and second dielectric tube portions each have a respective inner surface; and
    the respective inner surface of each of the first and second dielectric tube portions are disposed proximate to locations of the modal electric field nulls.

8. An apparatus as in claim 1 further comprising a second microwave resonant cavity concentrically overlapping the first microwave resonant cavity, wherein the first and second resonant microwave cavities support a resonant mode of microwaves spanning the first and second resonant microwave cavities.

9. An apparatus as in claim 8 wherein the low loss dielectric body comprises a first dielectric tube portion and further comprises a second dielectric tube portion concentrically arranged adjacent to the first dielectric tube portion of the body, the second tube portion substantially enclosing regions of the second microwave resonant cavity.

10. An apparatus as in claim 8 wherein the dielectric body includes first and second dielectric tube portions that are concentrically arranged so that the first microwave resonant cavity is concentrically disposed within the second microwave resonant cavity.

11. An apparatus comprising:
    a first resonant microwave cavity having three mutually orthogonal dimensions; and
    a low loss dielectric body enclosing each dimension of the first resonant microwave cavity;
    wherein the low loss dielectric body includes a first dielectric tube portion and further includes a second dielectric tube portion concentrically arranged adjacent to the first dielectric tube portion; and
wherein:
    the first and second dielectric tube portions each have a respective inner surface;
and
    the respective inner surface of each of the first and second dielectric tube portions are disposed at locations of modal electric field nulls of a resonant mode supported by the cavity.

12. An apparatus comprising:
    a plurality of resonant microwave cavities, for supporting a resonance mode of microwave therein having three mutually orthogonal dimensions; and
    a low loss dielectric body substantially enclosing each one of the three mutually orthogonal dimensions of the microwave resonant cavities.

13. An apparatus as in claim 12 wherein the resonance mode of microwaves supported by the resonant microwave cavities spans the resonant microwave cavities.

14. An apparatus as in claim 12 wherein:
    the low loss dielectric body has a plurality of inner surfaces;
    the plurality of resonant microwave cavities support a resonant mode of microwaves having modal electric field nulls;

and the inner surfaces of the low loss dielectric body are disposed proximate to locations of the modal electric field nulls.

15. An apparatus comprising:

a plurality of resonant microwave cavities; and a low loss dielectric body enclosing each of the microwave resonant cavities;

wherein:

the low loss dielectric body has a plurality of inner surfaces;

the plurality of resonant microwave cavities support a resonant mode of microwaves having modal electric field nulls;

and the inner surfaces of the low loss dielectric body are disposed proximate to locations of the modal electric field nulls.

16. An apparatus comprising:

a resonant microwave cavity; and a dielectric body including a hollow spool shaped member substantially enclosing the resonant microwave cavity, the hollow spool shaped member including a hollow dielectric tube portion extending between first and second dielectric plate portions, the first and second plate portions each having diameters larger than a diameter of the hollow dielectric tube portion.

17. A method for designing a high Q factor microwave resonator comprising:

selecting a resonant mode frequency and a height dimension of a microwave resonant cavity;

extending radial bessel function solutions along a radius of the cavity to determine radial locations of electric field nulls of a resonant mode of microwaves;

positioning concentric dielectric tubes proximate to the radial locations of the electric field nulls;

extending cavity harmonic function solutions along the axis of symmetry of the cavity to determine axial locations of electric field nulls of the resonant mode of microwaves; and positioning dielectric plates proximate to the axial locations of the electric field nulls.

* * * * *